(12) United States Patent
Inoue

(10) Patent No.: US 8,369,007 B2
(45) Date of Patent: Feb. 5, 2013

(54) FILTER FOR LIGHT RECEIVING ELEMENT, AND LIGHT RECEIVING DEVICE

(75) Inventor: Yasuaki Inoue, Osaka (JP)

(73) Assignee: Nalux Co., Ltd., Osaka (JP)

( * ) Notice: Subject to any disclaimer, the term of this patent is extended or adjusted under 35 U.S.C. 154(b) by 0 days.

(21) Appl. No.: 13/228,793

(22) Filed: Sep. 9, 2011

(65) Prior Publication Data

US 2012/0019904 A1 Jan. 26, 2012

Related U.S. Application Data (63) Continuation of application No. PCT/JP2009/006572, filed on Dec. 2, 2009.

(30) Foreign Application Priority Data

Mar. 13, 2009 (JP) ................................ 2009-061857

(51) Int. Cl.
*G06K 7/10* (2006.01)
(52) U.S. Cl. ......................................... 359/350
(58) Field of Classification Search .................. 359/359, 359/360, 578, 723, 885–891
See application file for complete search history.

(56) References Cited

U.S. PATENT DOCUMENTS

| | | |
|---|---|---|
| 5,040,116 A | 8/1991 | Evans, Jr. et al. |
| 5,598,145 A | 1/1997 | Shimotani et al. |
| 6,411,371 B1 | 6/2002 | Hinderling et al. |
| 7,391,008 B2 * | 6/2008 | Fouquet et al. ............... 250/226 |
| 7,489,397 B2 * | 2/2009 | Acevedo et al. ............. 356/326 |

FOREIGN PATENT DOCUMENTS

| | | |
|---|---|---|
| JP | 05-300514 | 11/1993 |
| JP | 06-326912 | 11/1994 |
| JP | 07-043604 | 2/1995 |
| JP | 3214195 | 7/2001 |
| JP | 3272699 | 1/2002 |
| JP | 2002-329297 | 11/2002 |
| JP | 2007-085832 A | 4/2007 |

OTHER PUBLICATIONS

International Search Report and Written Opinion corresponding to International Application No. PCT/JP2009/006572 dated Dec. 28, 2009.
European Communication pursuant to Article 94(3) EPC dated Sep. 13, 2012 corresponding to European Patent Application No. 09841426.1.
European Search Report dated Aug. 17, 2012 corresponding to European Patent Application No. 09841426.1.

\* cited by examiner

*Primary Examiner* — Arnel C Lavarias
*Assistant Examiner* — Tamara Y Washington
(74) *Attorney, Agent, or Firm* — Squire Sanders (US) LLP (57) ABSTRACT

A filter for a light receiving element, which can sufficiently eliminate disturbance due to sunlight and the like out of doors. The filter for a light receiving element according to one embodiment of the present invention is used for a light receiving element which receives signal light having a known spectral distribution. The filter for a light receiving element according to one embodiment of the present invention is configured so that when the energy density of the ambient light in the light receiving element is represented by N1 and the energy density of the signal light in the light receiving element is represented by N2, $N1/(N2)^2$ is minimized under constraints.

8 Claims, 7 Drawing Sheets

FILTER FOR LIGHT RECEIVING ELEMENT, AND LIGHT RECEIVING DEVICE

REFERENCE TO RELATED APPLICATIONS

This application is a continuation of International Application No. PCT/JP2009/006572 filed Dec. 2, 2009, which claims priority of Japanese Patent Application No. 2009-061857, filed on Mar. 13, 2009, the contents of which are hereby incorporated by reference.

FIELD OF THE INVENTION

The present invention relates to a filter for a light receiving element which receives signal light with a known spectral distribution and a light receiving device provided with the filter.

BACKGROUND ART

An image pick-up device which illuminates an object with a light having a known spectral distribution and receives light reflected by the object to obtain an image of the object (for example, JP3214195B) and a distance measuring device which measures a distance to an object (JP3272699B) have been developed. Further, an object detecting device which emits signal light having a known spectral distribution in the wavelength range of infrared light and the like toward the space to determine whether or not an object is present in the space is widely used.

When such an image pick-up device, such a distance measuring device, such an object detecting device and the like are used outdoors, in particular, accuracy of distance measurement and object detection will be significantly affected by ambient light such as the sunlight. In order to reduce the influence of the ambient light, a band-pass filter which passes through light in a wavelength range of the signal light is used. However, when intensity of the sunlight has a very strong influence outdoors, ambient light cannot be sufficiently removed by conventional methods.

PRIOR ART DOCUMENTS

Patent documents

Patent document 1: JP3214195
Patent document 2: JP3272699

SUMMARY OF THE INVENTION

Problem to be Solved by the Invention

So, there is a need for a filter for a light receiving element by which ambient light such as the sunlight outdoors can be sufficiently removed and a light receiving element in which an influence of the ambient light will be sufficiently removed.

Means for Solving the Problem

A filter for a light receiving element according to an aspect of the present invention is used for a light receiving element which receives signal light with a known spectral distribution. The filter for a light receiving element according to the aspect of the present invention is configured in such a way that when energy density of ambient light in the light receiving element is represented as N1 and energy density of signal light in the light receiving element is represented as N2, $N1/(N2)^2$ is minimized under constraints.

The filter for a light receiving element according to the aspect of the present invention is configured in such a way that $N1/(N2)^2$ is minimized under constraints. As a result, the S/N ratio of the light receiving element can be maximized under the constraints.

In a filter for a light receiving element according to an embodiment of the present invention, the signal light is in the wavelength range of infrared light.

In the present embodiment, the signal light which is in the wavelength range of infrared light is imperceptible to the human eye and therefore can be used in safe. Further, disturbance due to the sunlight can be reduced because radiation illuminance of the sunlight in the wavelength range of infrared light is smaller than that in the wavelength range of visible light.

In a filter for a light receiving element according to another embodiment of the present invention, a light source of the signal light is a laser or a light emitting diode.

In the present embodiment, the signal light with the known spectral distribution can easily be generated.

In a filter for a light receiving element according to another embodiment of the present invention, much of the ambient light is the sunlight.

In the present embodiment, N1 can be obtained with a high accuracy because the spectral distribution of the sunlight is known A light receiving device according to another aspect of the present invention includes a lens optical system, a light receiving element and a filter for a light receiving element according to any one of the embodiments of the present invention.

In the light receiving device according to the present aspect, signal can be received with a high accuracy by maximizing the S/N ratio under the constraints.

A distance measuring device according to another aspect of the present invention includes the light receiving device according to the aspect of the present invention.

The distance measuring device according to the present aspect of the present invention includes the light receiving device according to the aspect of the present invention and therefore it is capable of measuring distance with a high accuracy.

A method for producing a filter for a light receiving element according to the present invention is a method for producing a filter for a light receiving element which receives signal light with a known spectral distribution. The method includes the steps of provisionally determining specifications of the filter; determining N1 when energy density of ambient light in the light receiving element is represented as N1; determining N2 when energy density of signal light in the light receiving element is represented as N2; obtaining $N1/(N2)^2$; and specifications of the filter are determined such that $N1/(N2)^2$ is minimized under constraints.

According to the present invention, the light receiving device in which the S/N ratio is maximized under the constraints can be obtained by minimizing $N1/(N2)^2$ under the constraints.

In a method for producing a filter for a light receiving element according to an embodiment of the present invention, N1 is obtained based on a spectral distribution of ambient light and characteristic of the filter and N2 is obtained based on the known spectral distribution of the signal light and the characteristic of the filter.

In the present embodiment, $N1/(N2)^2$ can be obtained with a high accuracy when the spectral distribution of the ambient light is known. Accordingly, the light receiving device in which the S/N ratio is maximized can be produced without fail.

A filter for a light receiving element according to another aspect of the present invention is used for a light receiving element which receives signal light having a known spectral distribution and in which much of ambient light is the sunlight. The filter is configured such that a ratio of an amount of the signal light which passes through the filter to an amount of the signal light which enters the filter is determined to be 70% or more and 87% or less.

In the filter for a light receiving element according to the aspect of the present invention, an amount of the signal light which passes through the filter to an amount of the signal light which enters the filter is determined to be 70% or more and 87% or less and as a result a S/N ratio in the vicinity of the maximum can be obtained.

MODE FOR CARRYING OUT THE INVENTION

Figure 1:
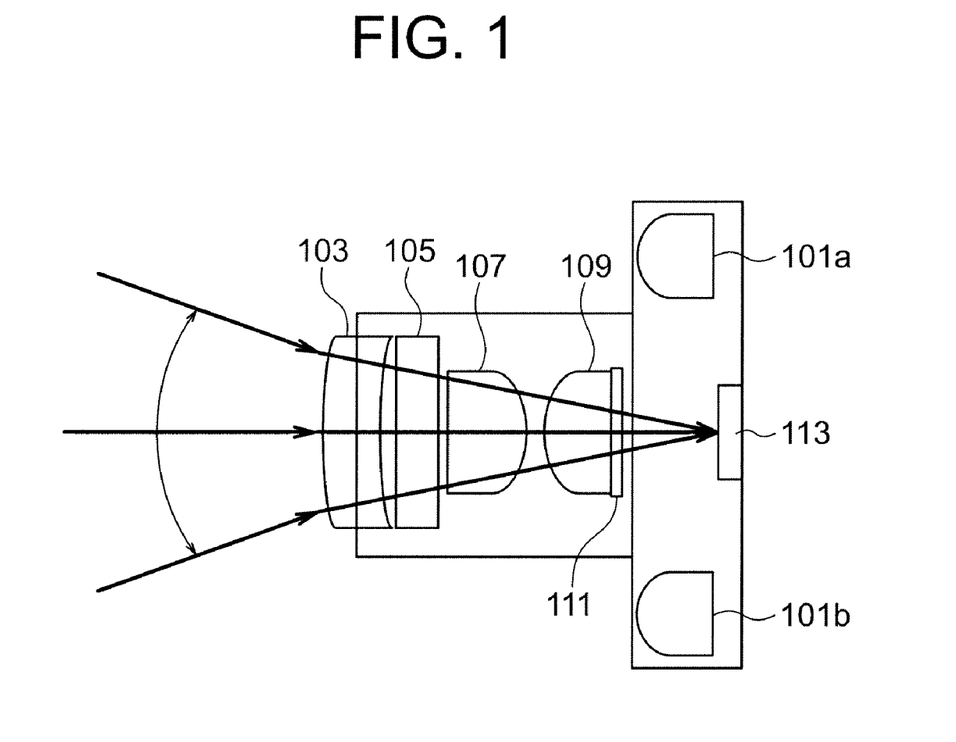
FIG. 1 shows an example of a block diagram of a distance measuring device with a filter for a light receiving element according to the present invention.
Figure 3:
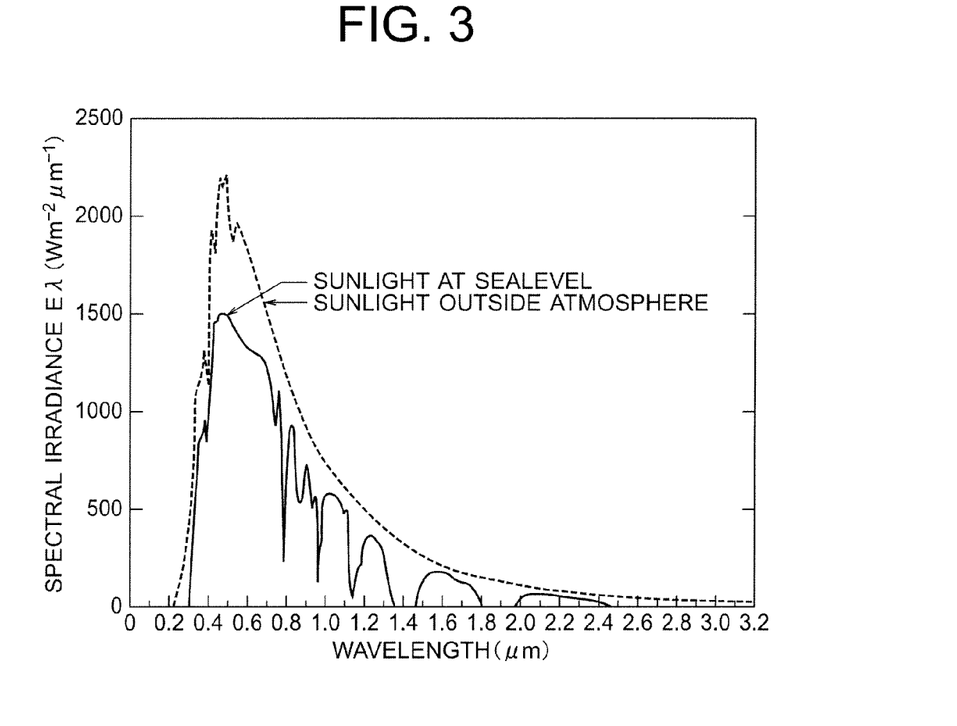
FIG. 3 shows a spectral distribution of the sunlight as main ambient light.

FIG. 1 shows an example of a block diagram of a distance measuring device with a filter for a light receiving element according to the present invention. In FIG. 1, light beams are emitted toward an object from a light source 101a and a light source 101b. The light sources may be lasers or light emitting diodes which emit light in the wavelength range of infrared light. The reasons why signal lights in the wavelength range of infrared light are used are that they can be used in safe because they are imperceptible to the human eye and that disturbance due to the sunlight can be reduced because radiation illuminance of the sunlight in the wavelength range of infrared light is smaller than that in the wavelength range of visible light as shown in FIG. 3. Light beams reflected by the object pass through a first lens 103, an absorbing filter 105, a second lens 107, a third lens 109 and a band-pass filter 111 and reach a light receiving element 113.

The first lens 103 may be a concave lens which serves to obtain an image with a wide angle of view. The second lens 107 may be a convex lens which serves to adjust various optical features. The third lens 109 may be a convex lens which serves to form an image on the light receiving element.

The light receiving element 113 may be an image pickup device such as a CCD (Charge-Coupled Device) and a CMOS (Complementary Metal-Oxide Semiconductor).

Data of an image formed on the light receiving element 113 by light beams are sent to a processing unit not shown and in the processing unit a distance to the object is obtained based on the phase principle or the operation time measurement principle. When the light receiving element 113 is a two-dimensional array, a two-dimensional image having distance data can be obtained.

Figure 2:
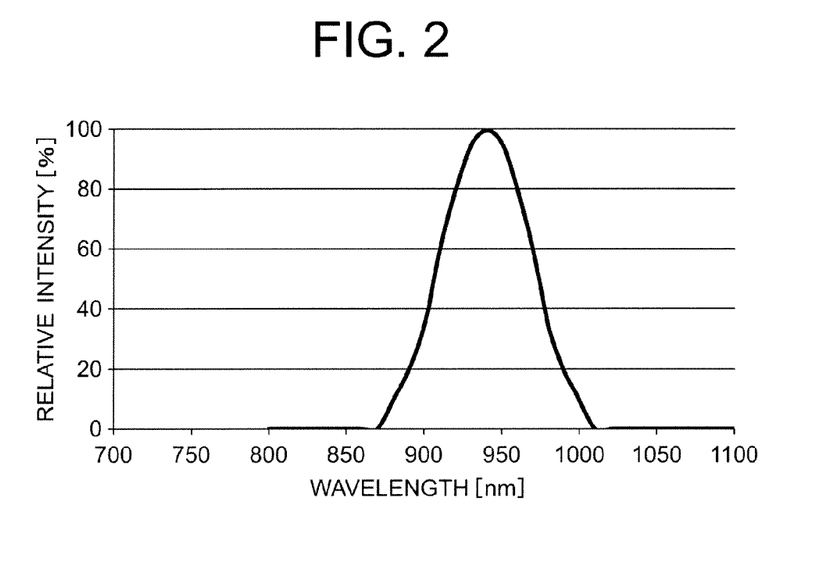
FIG. 2 shows an example of a spectral distribution of light emitted by the light sources.

FIG. 2 shows an example of a spectral distribution of light emitted by the light source 101a and the light source 101b. The horizontal axis indicates wavelength while the vertical axis indicates relative intensity. In the present example, the center wavelength of the emitted light is 940 nm.

FIG. 3 shows a spectral distribution of the sunlight as main ambient light.

Figure 4:
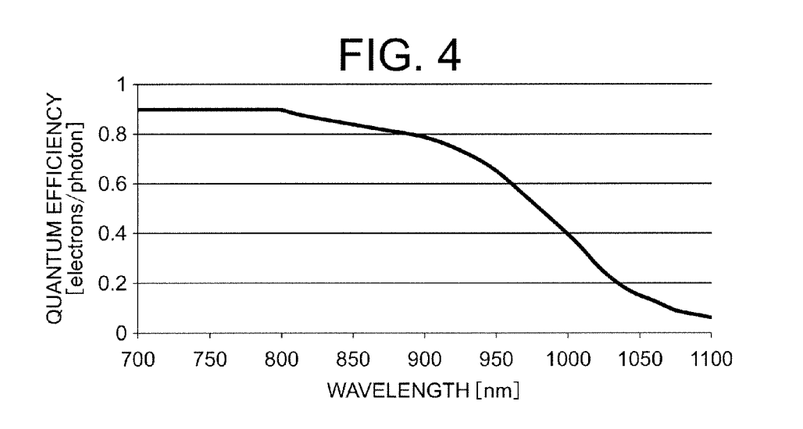
FIG. 4 shows an example of a quantum efficiency versus wavelength graph of the light receiving element.

FIG. 4 shows an example of a quantum efficiency versus wavelength graph of the light receiving element 113. Quantum efficiency is a ratio of the number of photons which are converted into electrons to the number of photons which have been received by the light receiving element 113.

Figure 5:
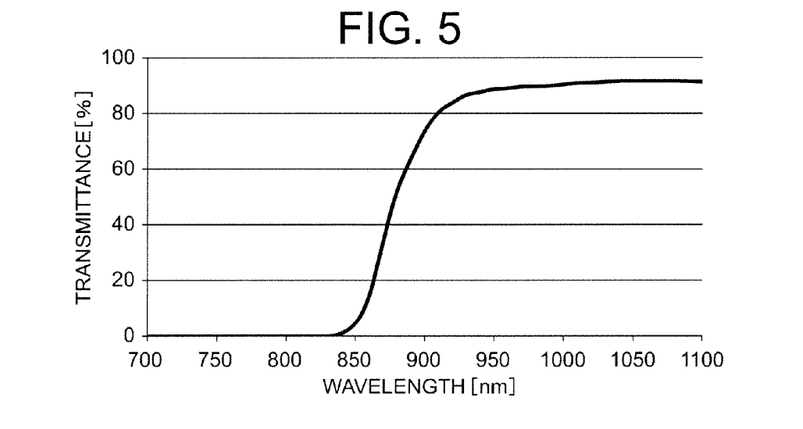
FIG. 5 shows an example of a transmittance versus wavelength graph of the absorbing filter.

FIG. 5 shows an example of a transmittance versus wavelength graph of the absorbing filter 105. The absorbing filter 105 is made of resin or glass to which a dye for absorption is added. Such a filter is commercially available. For example, polycarbonate base Jupilon 3000R (brand name) of Mitsubishi Engineering-Plastics Corporation can be used.

Figure 6:
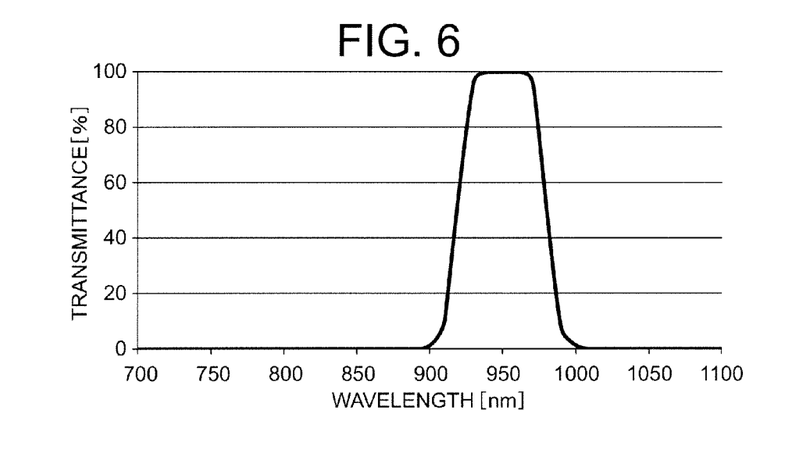
FIG. 6 shows an example of a transmittance versus wavelength graph of the band-pass filter.

FIG. 6 shows an example of a transmittance versus wavelength graph of the band-pass filter 111. The band-pass filter 111 is a filter including a dielectric multilayer film or a filter with a dye or a pigment. The center wavelength of the pass-band of the band-pass filter 111 should preferably be set to the center wavelength of the emitted light. An example of the filter including a dielectric multilayer film is described in JP2005-266653A. An example of the filter with a dye or a pigment is described Japanese Utility Model Publication 5-21201.

Figure 7:
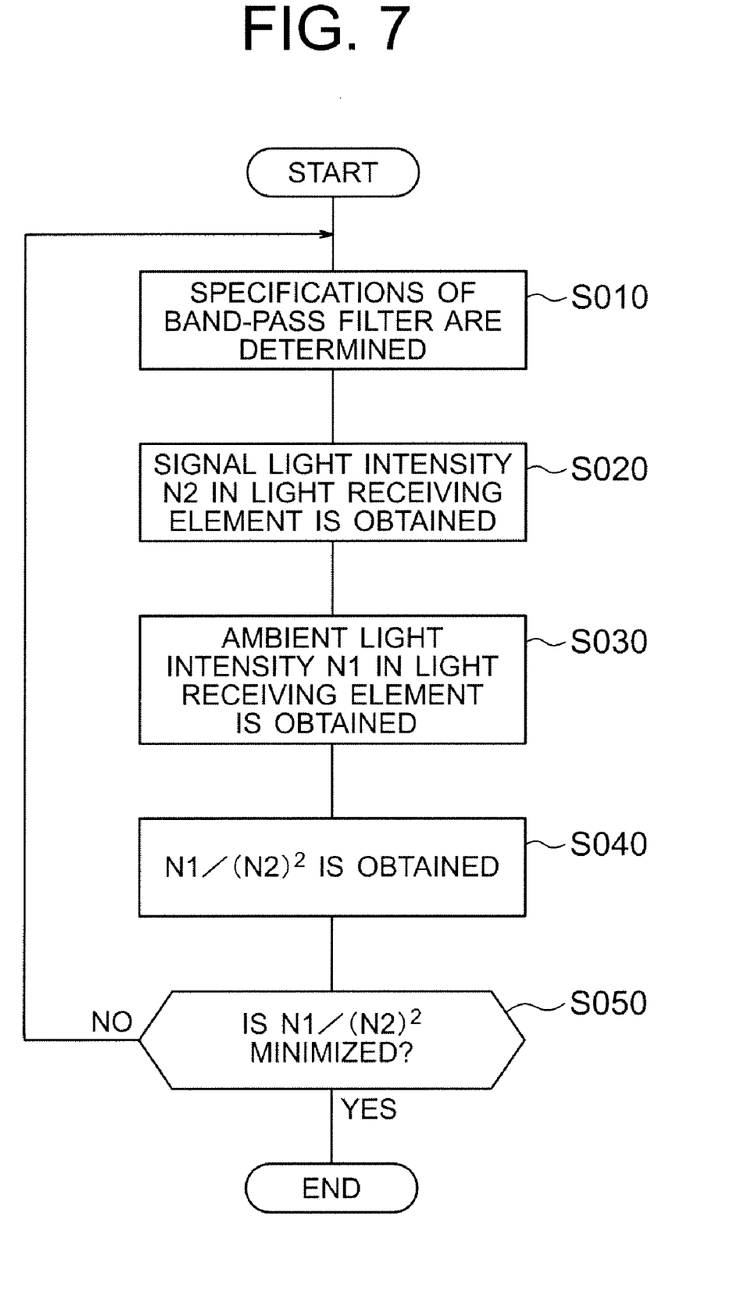
FIG. 7 shows a flowchart of a procedure to determine specifications of the band-pass filter.

FIG. 7 shows a flowchart of a procedure to determine specifications of the band-pass filter 111. To determine specifications of the band-pass filter 111 means to determine a transmittance versus wavelength characteristic of the band-pass filter 111. How to determine specifications of the band-pass filter 111 will be described below for the case in which main ambient light is the sunlight, for example.

At first, S/N ratio is considered. "S" represents intensity of signal light while "N" represents noise, that is, intensity of ambient light. In general, intensity of signal light S is calculated as below.

$S$=(Number of received photons of the signal light)×(Quantum efficiency of the light receiving element)×(Integration time)×(Area of the light receiving element)

On the other hand, assume that noise N can be calculated as below.

$N$=Constant×(Number of received photons of ambient light)$^{1/2}$

The reason that N is proportional to square root of the number of received photons is that the assumption that noise components behave like photon shot noise is employed. An average value of the number of photons is determined by intensity of the light source while a distribution of the number of photons shows a Poisson distribution. Accordingly, standard deviation from the average value of the number of photons is given as a square root of the number of photons. The above-mentioned assumption will be studied later.

Accordingly, the following equation is obtained.

$$S/N = A \times (\text{Number of received photons of signal light})/(\text{Number of received photons of ambient light})^{1/2} \quad (1)$$

"A" represents a constant. When the inverses of squares of the both sides of Equation (1) are obtained, the following equation is obtained.

$$(N/S)^2 = B \times (\text{Number of received photons of ambient light})/(\text{Number of received photons of signal light})^2 \quad (2)$$

"B" is defined as below.

$$B = 1/A^2$$

When the number of received photons of ambient light is represented by energy density of the ambient light N1 in the light receiving element and the number of received photons of signal light is represented by energy density of the signal light N2 in the light receiving element in Equation (2), the following term is obtained.

$$N1/(N2)^2 \quad (3)$$

In step S010 of FIG. 7, specifications (a transmittance versus wavelength graph) of the band-pass filter 111 are provisionally determined.

In step S020 of FIG. 7, an energy density of the signal light N2 in the light receiving element 113 is obtained. The energy density of the signal light N2 in the light receiving element 113 may be obtained through measurement or thorough calculation. When the energy density of the signal light N2 is obtained through measurement, spectrum and intensity of light which has been emitted by the light source, has been reflected and scattered by the object and has passed through the band-pass filter and then has been received by the light receiving element 113 in an environment without ambient light are measured by a spectrum analyzer or the like. The energy density of the signal light N2 is obtained from the measured light intensity data for respective values of wavelength. When the energy density of the signal light N2 is obtained through calculation, light emitting intensity (I0) of the light source for each wavelength, reflectance of the object (R1), transmittance of the absorbing filter (T1) and transmittance of the band-pass filter (T2) for each wavelength are measured in advance. Further, light capturing efficiency (η) determined by lens design is calculated. A product of light emitting intensity (I0) of the light source for each wavelength, reflectance of the object (R1), transmittance of the absorbing filter (T1) and transmittance of the band-pass filter (T2) for each wavelength and light capturing efficiency (η) will be energy density of the signal light N2 for each wavelength. When obtaining N2, the product may be further multiplied by quantum efficiency of the light receiving element 113 (FIG. 4) to obtain an effective energy density.

In step S030 of FIG. 7, energy density of ambient light N1 in the light receiving element 113 is obtained. The energy density of ambient light N1 in the light receiving element 113 may be obtained through measurement or thorough calculation. When the energy density of the ambient light N1 is obtained through measurement, spectrum and intensity of the sunlight which has been reflected and scattered by the object, has passed through the band-pass filter and then has been received by the light receiving element 113 in an environment without signal light and ambient light besides the sunlight are measured by a spectrum analyzer or the like. The energy density of the ambient light N1 is obtained from the measured light intensity data for respective values of wavelength. When the energy density of the ambient light N1 is obtained through calculation, light emitting intensity (Is) of the sunlight for each wavelength, reflectance (R2) of the object, transmittance of the absorbing filter (T3) and transmittance of the band-pass filter (T4) for each wavelength are measured in advance. Further, light capturing efficiency (η) determined by lens design is calculated. A product of light emitting intensity (Is) of the sunlight for each wavelength, reflectance of the object (R2), transmittance of the absorbing filter (T3) and transmittance of the band-pass filter (T4) for each wavelength and light capturing efficiency (η) will be energy density of the sunlight N1 for each wavelength. When obtaining N1, the product may be further multiplied by quantum efficiency of the light receiving element 113 (FIG. 4) to obtain an effective energy density.

In step S040 of FIG. 7, a value of $$N1/(N2)^2$$

is obtained.

In step S050 of FIG. 7, transmittance of the band-pass filter 111 is changed such that a value of $$N1/(N2)^2$$

is minimized.

Detailed description on step S050 in FIG. 7 will be given below.

FIGS. 8A, 8B, 8C and 8D show characteristics of various band-pass filters with the center wavelength of 940 nm. Transmittance of a band-pass filter is a ratio of an amount of signal light which passes through the band-pass filter to an amount of signal light which enters the band-pass filter. The horizontal axis indicates wavelength while the vertical axis indicates relative intensity of light which has passed through the band-pass filter. Shapes of the band-pass filters are trapezoidal and the characteristic is changed by changing length of the lower base of a trapezoid. FIGS. 8A, 8B, 8C and 8D show characteristics of band-pass filters lower bases of which are 140 nm, 100 nm, 85 nm and 70 nm long, respectively and spectral distributions of signal lights. When a band-pass filter is made from a dielectric multilayer film, for example, the characteristic of the band-pass filter can be changed by adjusting materials of layers, thicknesses of layers and the number of layers.

Figure 8A:
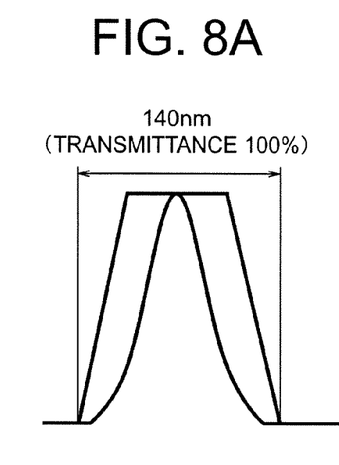
FIGS. 8A, 8B, 8C and 8D show characteristics of various band-pass filters with the center wavelength of 940 nm.
Figure 8B:
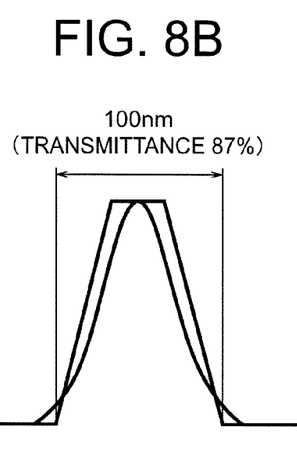
Figure 8C:
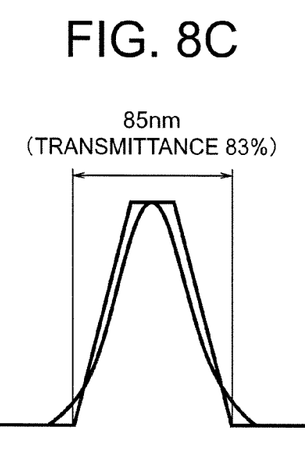

Table 1 shows values of transmittance and $$N1/(N2)^2$$

of the band-pass filters shown in FIGS. 8A, 8B, 8C and 8D. In Table 1, value of $$N1/(N2)^2$$

is minimized in the case of FIG. 8C.

Figure 10:
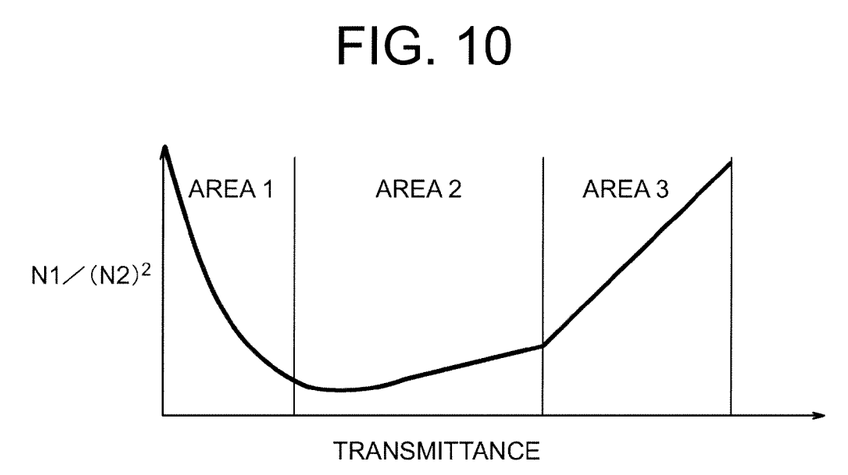
FIG. 10 shows a relationship between transmittance defined in connection with FIG. 8 and FIG. 9 and $N1/(N2)^2$.

In general, a relationship between transmittance and $$N1/(N2)^2$$

of a band-pass filter is represented by the function shown in FIG. 10, which will be described later. Accordingly, to obtain the minimum value of $$N1/(N2)^2$$

is to obtain the minimum value of the function shown in FIG. 10. In order to obtain the minimum value of the function, for example, the whole range of transmittance of the band-pass filter indicated by the horizontal axis may be divided into sufficiently small sections, values of $$N1/(N2)^2$$

may be obtained for respective sections and minimum value among the values may be obtained.

TABLE 1

Figure 8D:
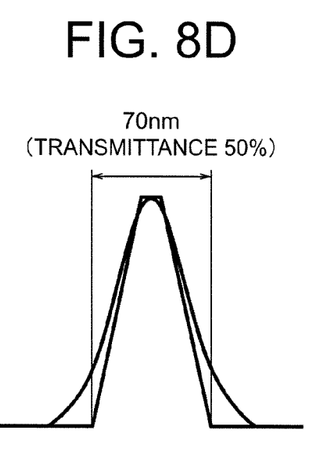

| Characteristic of Band-pass filter | Transmittance of Band-pass filter (%) | $N1/(N2)^2$ |
|---|---|---|
| FIG. 8A | 100 | 24.0 |
| FIG. 8B | 87 | 21.4 |
| FIG. 8C | 83 | 18.9 |
| FIG. 8D | 50 | 40.0 |

FIGS. 9A, 9B, 9C and 9D show characteristics s of various band-pass filters with the center wavelength of 850 nm. The horizontal axis indicates wavelength while the vertical axis indicates relative intensity of light which has passed through the band-pass filter. Shapes of the band-pass filters are trapezoidal and the characteristic is changed by changing length of the lower base of a trapezoid. FIGS. 9A, 9B, 9C and 9D show characteristics of band-pass filters lower bases of which are 100 nm, 70 nm, 60 nm and 45 nm long, respectively and spectral distributions of signal lights.

Figure 9A:
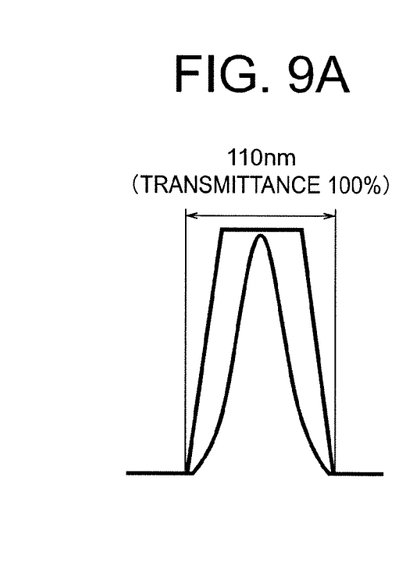
FIGS. 9A, 9B, 9C and 9D show characteristics of various band-pass filters with the center wavelength of 850 nm.
Figure 9B:
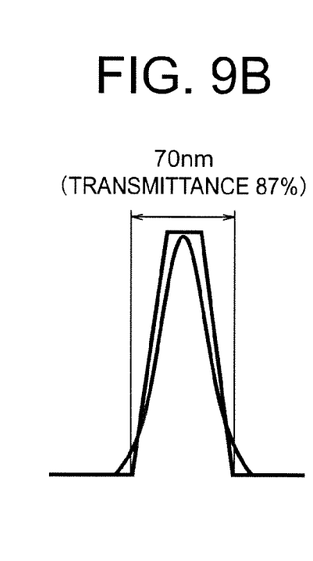
Figure 9C:
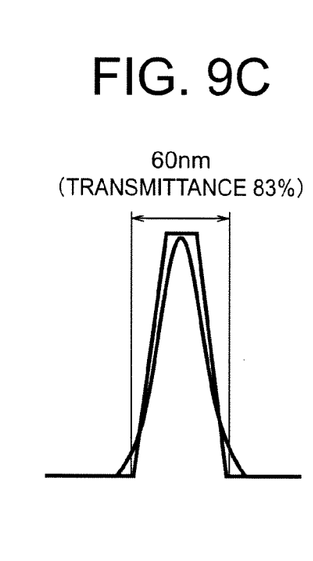

Table 2 shows values of transmittance and $$N1/(N2)^2$$

of the band-pass filters shown in FIGS. 9A, 9B, 9C and 9D. In Table 2, value of $$N1/(N2)^2$$

is minimized in the case of FIG. 9C.

TABLE 2

Figure 9D:
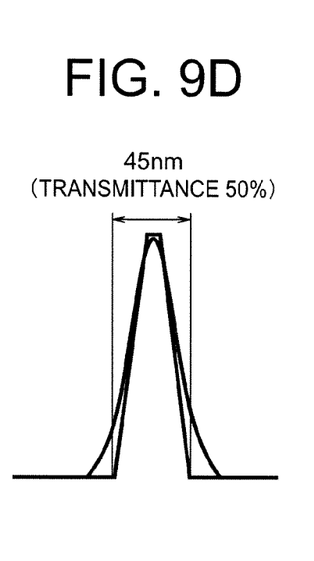

| Characteristic of Band-pass filter | Transmittance of Band-pass filter (%) | $N1/(N2)^2$ |
|---|---|---|
| FIG. 9A | 100 | 66.5 |
| FIG. 9B | 87 | 51.5 |
| FIG. 9C | 83 | 45.7 |
| FIG. 9D | 50 | 84.0 |

When values of $$N1/(N2)^2$$

in Table 1 are compared with those in Table 2, those in Table 1 are generally smaller than those in Table 2. The reason is below. In the spectral distribution shown in FIG. 3, radiation illuminance at 940 nm is extremely smaller than that at 850 nm. This results from a difference between spectral absorptance at 940 nm and that at 850 nm on the surface of the Earth. Accordingly, use of signal light at 940 nm will reduce a value of $$N1/(N2)^2$$

and therefore will increase the S/N ratio.

In the method described above and shown in FIG. 7, when the band width is obtained for a fixed center wavelength, the S/N ratio can be maximized for the fixed center wavelength by minimizing $$N1/(N2)^2.$$

In this case, the constraints are the shape and the center wavelength of the band-pass filter 111. Further, after the band width that maximizes the S/N ratio has been obtained for each center wavelength, the center wavelength that maximizes the S/N ratio can be determined. In this case, the constraint is the shape of the band-pass filter 111.

In the embodiments described above, the filters are of trapezoidal shapes which are determined by length of the lower bases. Other shapes can be changed arbitrarily to maximize the S/N ratio.

Thus, in the method shown in FIG. 7, specifications (a transmittance versus wavelength graph) of the band-pass filter 111 can be determined so as to maximize the S/N ratio by minimizing $$N1/(N2)^2$$

under constraints.

FIG. 10 shows a relationship between transmittance of the band-pass filter and $$N1/(N2)^2.$$

The horizontal axis indicates transmittance of the band-pass filter. The vertical axis indicates $$N1/(N2)^2.$$

In area 3, as transmittance of the band-pass filter decreases, $$N1/(N2)^2$$

decreases and the S/N ratio increases. In area 2, $$N1/(N2)^2$$

reaches its minimum value and the S/N ratio reaches its maximum value. In area 1, as transmittance of the band-pass filter decreases, $$N1/(N2)^2$$

increases and the S/N ratio decreases.

In general, in the case that the main ambient light is the sunlight, a value of $$N1/(N2)^2$$

reaches the vicinity of the minimum value when transmittance of the band-pass filter is 70% or more and 87% or less. The value abruptly increases outside the range. Accordingly, the S/N ratio in the vicinity of the maximum value can be obtained by setting transmittance of the band-pass filter to 70% or more and 87% or less.

Figure 11:
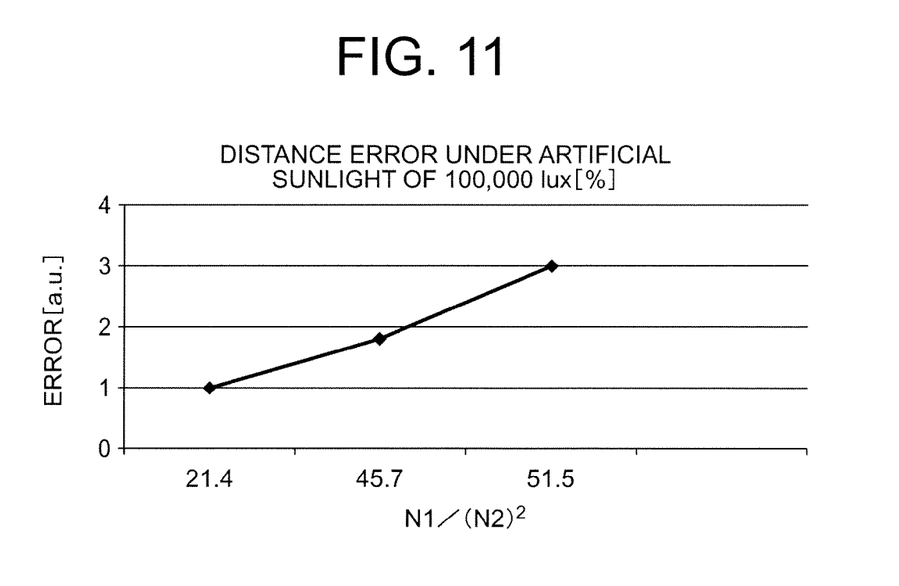
FIG. 11 shows a relationship between $N1/(N2)^2$ and accuracy of distance measurement of the distance measuring device shown in FIG. 1.

FIG. 11 shows a relationship between $$N1/(N2)^2$$

and accuracy of distance measurement of the distance measuring device shown in FIG. 1. The horizontal axis indicates $$N1/(N2)^2$$

while the vertical axis indicates error in distance measurement (relative values in an arbitrary unit). Data in FIG. 11 are collected by performing distance measurement with the distance measuring device under artificial sunlight of 100,000 lux. FIG. 11 proves that a value of $$N1/(N2)^2$$

and an amount of error in distance measurement are substantially proportional to each other. Accordingly, Equation (1) and Equation (2) which have been obtained with the assumption that noise components behave like photon shot noise are found to be appropriate. Consequently, error in distance measurement can be minimized by minimizing $$N1/(N2)^2.$$

The invention claimed is:
1. A filter for a light receiving element which receives signal light with a known spectral distribution
wherein when energy density of ambient light in the light receiving element is represented as N1 and energy density of signal light in the light receiving element is rep- resented as N2, a ratio of an amount of light which passes through the filter to an amount of light which enters the filter is determined in a range from 70% to 87% such that $N1/(N2)^2$ is minimized while changing a ratio of an amount of light which passes through the filter to an amount of light which enters the filter by changing the transmittance versus wavelength characteristic of the filter.

2. A filter for a light receiving element according to claim 1, wherein the signal light is in the wavelength range of infrared light.

3. A filter for a light receiving element according to claim 2, wherein a light source of the signal light is a laser or a light emitting diode.

4. A filter for a light receiving element according to claim 1, wherein much of the ambient light is the sunlight.

5. A light receiving device which includes a lens optical system, a light receiving element and a filter for light receiving elements according to claim 1.

6. A distance measuring device which includes the light receiving device according to claim 5.

7. A method for producing a filter for a light receiving element which receives signal light with a known spectral distribution, the method comprising the steps of:
provisionally determining a transmittance versus wavelength characteristic of the filter;
determining N1 when energy density of ambient light in the light receiving element is represented as N1;
determining N2 when energy density of signal light in the light receiving element is represented as N2; and
obtaining $N1/(N2)^2$;
minimizing $N1/(N2)^2$ while changing a ratio of an amount of light which passes through the filter to an amount of light which enters the filter by changing the transmittance versus wavelength characteristic of the filter.

8. A method for producing a filter for a light receiving element according to claim 7, wherein N1 is obtained based on a spectral distribution of ambient light and the transmittance versus wavelength characteristic of the filter and N2 is obtained based on the known spectral distribution of the signal light and the transmittance versus wavelength characteristic of the filter.

* * * * *